United States Patent [19]

Kadosh et al.

[11] Patent Number: 5,759,897

[45] Date of Patent: Jun. 2, 1998

[54] METHOD OF MAKING AN ASYMMETRICAL TRANSISTOR WITH LIGHTLY AND HEAVILY DOPED DRAIN REGIONS AND ULTRA-HEAVILY DOPED SOURCE REGION

[75] Inventors: Daniel Kadosh, Austin; Mark I. Gardner, Cedar Creek; Robert Dawson, Austin, all of Tex.

[73] Assignee: Advanced Micro Devices, Inc., Sunnyvale, Calif.

[21] Appl. No.: 711,382

[22] Filed: Sep. 3, 1996

[51] Int. Cl.⁶ .................................................. H01L 21/336
[52] U.S. Cl. ............................ 438/286; 438/305; 438/307
[58] Field of Search ................................... 438/286, 305, 438/306, 307, 175, 190

[56] References Cited

U.S. PATENT DOCUMENTS

| | | | |
|---|---|---|---|
| 5,286,664 | 2/1994 | Horiuchi | 438/286 |
| 5,366,915 | 11/1994 | Kodama | 438/286 |
| 5,424,229 | 6/1995 | Oyamatsu | 437/35 |
| 5,510,279 | 4/1996 | Chien et al. | 438/302 |
| 5,547,888 | 8/1996 | Yamazaki | 438/286 |
| 5,578,509 | 11/1996 | Fujita | 438/286 |
| 5,585,658 | 12/1996 | Mukai et al. | 257/344 |
| 5,607,869 | 3/1997 | Yamazaki | 438/286 |
| 5,648,286 | 7/1997 | Gardner et al. | 438/286 |
| 5,672,531 | 9/1997 | Gardner et al. | 438/286 |
| 5,677,224 | 10/1997 | Kadosh et al. | 257/274 |

FOREIGN PATENT DOCUMENTS

| | | | |
|---|---|---|---|
| 61-194777 | 8/1986 | Japan . | |
| 4-18762 | 1/1992 | Japan | 257/408 |

OTHER PUBLICATIONS

U.S. Patent Application, Serial No. 08/682,493, filed Jul. 17, 1996, entitled "Method For Fabrication Of A Non–Symmetrical Transistor", by Mark I. Gardner, Michael P. Duane and Derick J. Wristers, pending.

*Primary Examiner*—Michael Trinh
*Attorney, Agent, or Firm*—Skjerven, Morrill, MacPherson, Franklin & Friel LLP; David M. Sigmond

[57] ABSTRACT

An asymmetrical IGFET including a lightly and heavily doped drain regions and an ultra-heavily doped source region is disclosed. Preferably, the lightly doped drain region and ultra-heavily doped source region provide channel junctions. A method of making the IGFET includes providing a semiconductor substrate, forming a gate with first and second opposing sidewalls over the substrate, applying a first ion implantation to implant lightly doped source and drain regions into the substrate, applying a second ion implantation to convert substantially all of the lightly doped source region into a heavily doped source region without doping the lightly doped drain region, forming a drain-side spacer adjacent to the second sidewall, and applying a third ion implantation to convert the heavily doped source region into an ultra-heavily doped source region and to convert a portion of the lightly doped drain region outside the drain-side spacer into a heavily doped drain region without doping a portion of the lightly doped drain region beneath the drain-side spacer. Advantageously, the IGFET has low source-drain series resistance and reduces hot carrier effects.

18 Claims, 3 Drawing Sheets

METHOD OF MAKING AN ASYMMETRICAL TRANSISTOR WITH LIGHTLY AND HEAVILY DOPED DRAIN REGIONS AND ULTRA-HEAVILY DOPED SOURCE REGION

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the channel and the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped poly-silicon in place of aluminum as the gate. Since polysilicon has the same high melting point as a silicon substrate, typically a blanket polysilicon layer is deposited prior to source and drain formation, and the polysilicon is anisotropically etched to provide a gate which provides a mask during formation of the source and drain by ion implantation. Thereafter, a drive-in step is applied to repair crystalline damage and to drive-in and activate the implanted dopant.

As IGFET dimensions are reduced and the supply voltage remains constant (e.g., 3 V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to the gate on which sidewall spacers have been formed. The spacers are typically oxides or nitrides. The purpose of the lighter first dose is to form a lightly doped region of the drain (or LDD) at the edge near the channel. The second heavier dose forms a low resistivity heavily doped region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used), however lightly doped regions are typically formed for both the source and drain to avoid additional processing steps.

Disadvantages of LDDs include increased fabrication complexity and increased parasitic resistance due to their light doping levels. During operation, LDD parasitic resistance decreases drain current. Linear drain current (i.e., drain current in the linear or triode region) is reduced by the parasitic resistance in both the source and drain. Saturation drain current (i.e., drain current in the saturation region) is largely unaffected by the parasitic resistance of the drain but greatly reduced by the parasitic resistance of the source. Therefore, saturation drain current can be improved while reducing hot carrier effects by providing a lightly doped region only on the drain side. That is, the drain includes lightly and heavily doped regions, and the entire source is heavily doped.

Asymmetrical IGFETs (with asymmetrically doped sources and drains) are known in the art. For instance, U.S. Pat. No. 5,424,229 entitled "Method For Manufacturing MOSFET Having An LDD Structure" by Oyamatsu discloses providing a mask with an opening over a substrate, implanting a dopant through the opening at an angle to the substrate to form a lightly doped drain region on one side without a corresponding source region on the other side, forming a gate in the opening which overlaps the lightly doped drain region, removing the mask, and implanting heavily doped source and drain regions using the gate as an implant mask. As another example, U.S. Pat. No. 5,286,664 entitled "Method For Fabricating The LDD-MOSFET" by Horiuchi discloses forming a gate, implanting lightly doped source and drain regions using the gate as an implant mask, forming a photoresist layer that covers the source side and exposes the drain side, depositing a single spacer on the drain side using liquid phase deposition (LPD) of silicon dioxide, stripping the photoresist, and implanting heavily doped source and drain regions using the gate and single spacer as an implant mask.

A drawback to these and other conventional asymmetrical IGFETs is that the heavily doped source and drain regions typically have identical dopant concentrations. Although the doping concentration of the heavily doped drain region may be constrained in order to reduce hot carrier effects, the doping concentration of the heavily doped source region need not be constrained in this manner. Furthermore, increasing the doping concentration of the heavily doped source region reduces the source-drain series resistance, thereby improving drive current.

Accordingly, a need exists for an improved asymmetrical IGFET which reduces both source-drain series resistance and hot carrier effects.

SUMMARY OF THE INVENTION

The present invention provides an asymmetrical IGFET with lightly and heavily doped drain regions and an ultra-heavily doped source region. Preferably, the lightly doped drain region and the ultra-heavily doped source region provide channel junctions, and the heavily doped drain region is spaced from the channel junctions. Advantageously, the IGFET has low source-drain series resistance and reduces hot carrier effects.

By definition, the dopant concentration of the ultra-heavily doped source region exceeds that of the heavily doped drain region, and the dopant concentration of the heavily doped drain region exceeds that of the lightly doped drain region.

Preferably, the IGFET includes a source that consists of the ultra-heavily doped source region, and a drain that consists of the lightly doped and heavily doped drain regions. It is also preferred that the dopant concentration of the ultra-heavily doped source region is in the range of 1.5 to 10 times that of the heavily doped drain region, and the dopant concentration of the heavily doped drain region is in the range of 10 to 100 times that of the lightly doped drain region, and furthermore that the dopant concentration of the lightly doped drain region is in the range of about $1\times10^{17}$ to $5\times10^{18}$ atoms/cm$^3$, the dopant concentration of the heavily doped drain region is in the range of about $1\times10^{19}$ to $1\times10^{20}$ atoms/cm$^3$, and the dopant concentration of the ultra-heavily doped source region is in the range of about $1.5\times10^{19}$ to $1\times10^{21}$ atoms/cm$^3$.

In accordance with another aspect of the invention, a method of making the IGFET includes providing a semiconductor substrate, forming a gate with first and second opposing sidewalls over the substrate, applying a first ion implantation to implant lightly doped source and drain regions into the substrate, forming a drain-side spacer adjacent to the second sidewall, applying a second ion implantation to convert substantially all of the lightly doped source region into a heavily doped source region without doping the lightly doped drain region, and applying a third ion implantation to convert the heavily doped source region into an ultra-heavily doped source region and to convert a portion of the lightly doped drain region outside the drain-side spacer into a heavily doped drain region without doping a portion of the lightly doped drain region beneath the drain-side spacer.

Preferably, the method includes applying the first ion implantation using the gate as an implant mask, forming an insulating layer that includes first and second sidewall insulators adjacent to the first and second sidewalls, respectively, forming first and second spacers adjacent to the first and second sidewall insulators, respectively, wherein the drain-side spacer includes the second spacer and the second sidewall insulator, forming a masking layer over the substrate, wherein the masking layer includes an opening above the lightly doped source region and the first spacer and the first sidewall insulator and a first portion of the gate, and the masking layer covers the lightly doped drain region and the second spacer and the second sidewall insulator and a second portion of the gate, removing the first spacer, applying the second ion implantation using the masking layer and the first portion of the gate and the first sidewall insulator as an implant mask, stripping the masking layer, and applying the third ion implantation using the gate and the second sidewall insulator and the second spacer as an implant mask.

These and other aspects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
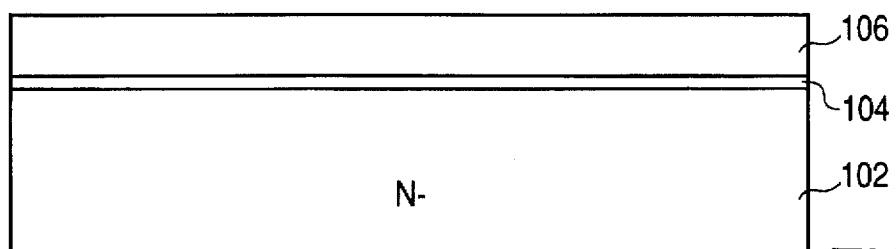
FIGS. 1A–1K show cross-sectional views of successive process steps for making an asymmetrical IGFET with a lightly doped and heavily doped drain regions and an ultra-heavily doped source region in accordance with an embodiment of the invention.

In the drawings, depicted elements are not necessarily drawn to scale and like or similar elements may be designated by the same reference numeral throughout the several views.

In FIG. 1A, silicon substrate 102 suitable for integrated circuit manufacture includes N-type surface layer with a planar top surface and an arsenic background concentration on the order of $1\times10^{16}$ atoms/cm$^3$, a <100> orientation and a resistivity of 12 ohm-cm. The N- type surface layer can, for instance, extend across substrate 102, or be an N-well in a P-type surface layer. Gate oxide 104, composed of silicon dioxide ($SiO_2$), is formed on the top surface of substrate 102 using tube growth at a temperature of 700° to 1000° C. in an $O_2$ containing ambient. Gate oxide 104 has a thickness of 50 angstroms. Thereafter, a blanket layer of undoped polysilicon 106 is deposited by low pressure chemical vapor deposition (LPCVD) on the top surface of gate oxide 104. Polysilicon 106 has a thickness of 2000 angstroms. If desired, polysilicon 106 can be doped in situ as deposition occurs, or doped before a subsequent etch step by implanting boron difluoride ($BF_2$) with a dosage in the range of $1\times10^{15}$ to $5\times10^{15}$ atoms/cm$^2$ and an energy in the range of 2 to 80 kiloelectron-volts. However, it is generally preferred that polysilicon 106 be doped during an implantation step following a subsequent etch step.

Figure 1B:
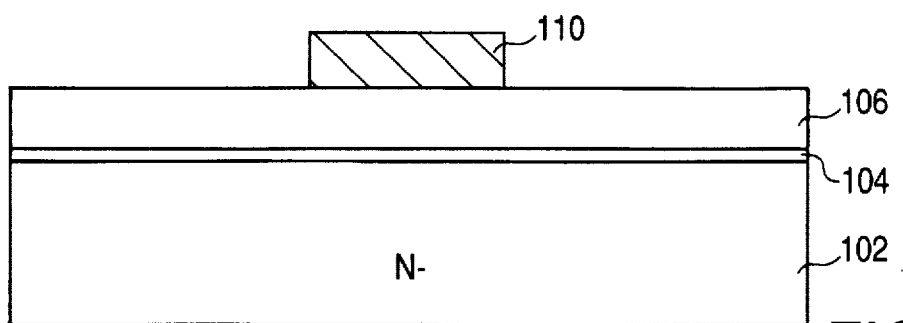

In FIG. 1B, photoresist 110 is deposited as a continuous layer on polysilicon 106 and selectively irradiated using a photolithographic system, such as a step and repeat optical projection system, in which I-line ultraviolet light from a mercury-vapor lamp is projected through a first reticle and a focusing lens to obtain a first image pattern. Thereafter, photoresist 110 is developed and the irradiated portions are removed to provide openings in photoresist 110. The openings expose portions of polysilicon 106, thereby defining a gate.

Figure 1C:
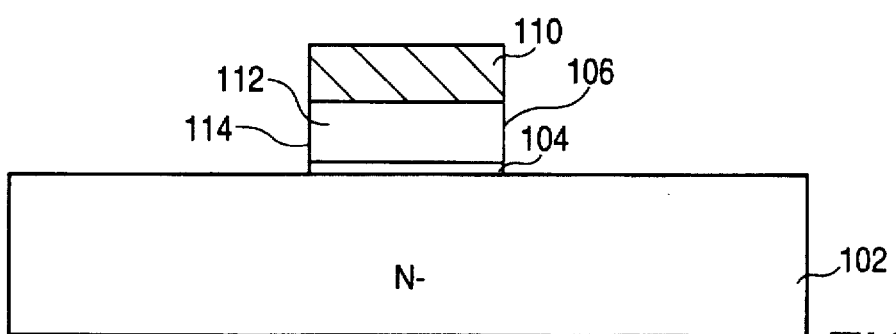

In FIG. 1C, an anisotropic etch is applied that removes the exposed portions of polysilicon 106 and the underlying portions of gate oxide 104. Preferably, a first dry etch is applied that is highly selective of polysilicon, and a second dry etch is applied that is highly selective of silicon dioxide, using photoresist 110 as an etch mask. After etching occurs, the remaining portion of polysilicon 106 provides polysilicon gate 112 with opposing vertical sidewalls 114 and 116. Polysilicon gate 112 has a length (between sidewalls 114 and 116) of 3500 angstroms.

Figure 1D:
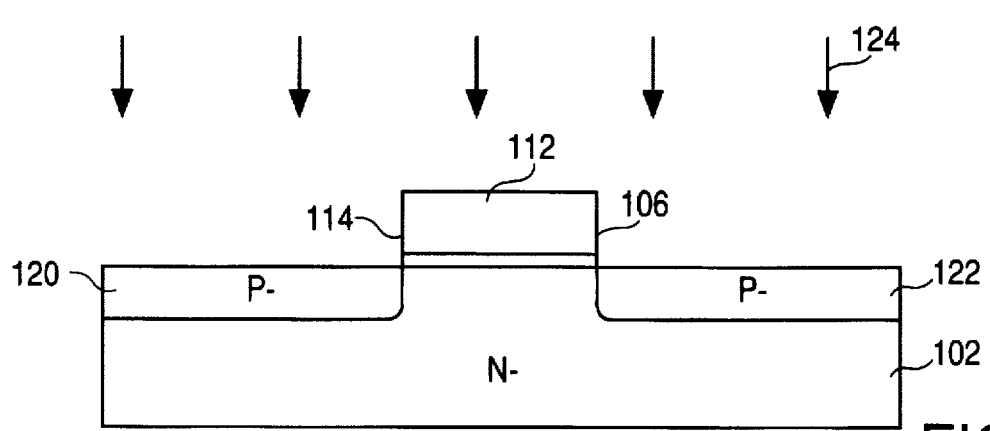

In FIG. 1D, photoresist 110 is stripped, and lightly doped source and drain regions 120 and 122 are implanted into substrate 102 by subjecting the structure to ion implantation of boron difluoride, indicated by arrows 124, at a dose in the range of $1\times10^{13}$ to $5\times10^{14}$ atoms/cm$^2$ and an energy in the range of 2 to 35 kiloelectron-volts. Polysilicon gate 112 provides an implant mask for the underlying portion of substrate 102. As a result, lightly doped source and drain regions 120 and 122 are substantially aligned with sidewalls 114 and 116, respectively. Lightly doped source and drain regions 120 and 122 are doped P- with a boron concentration in the range of about $1\times10^{17}$ to $1.5\times10^{18}$ atoms/cm$^3$.

Figure 1E:
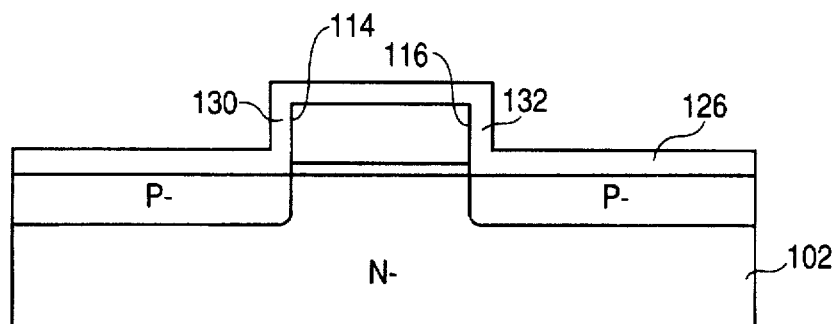

In FIG. 1E, oxide layer 126 is deposited over substrate 102 using a low temperature deposition process. Oxide layer 126 has a thickness in the range of 100 to 500 angstroms. Oxide layer 126 includes sidewall oxide 130 adjacent to sidewall 114, and sidewall oxide 132 adjacent to sidewall 116.

Figure 1F:
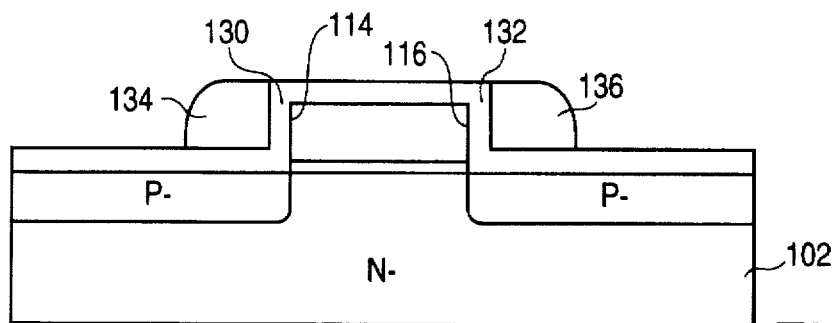

In FIG. 1F, a blanket layer of silicon nitride ($Si_3N_4$) with a thickness of 2500 angstroms is conformally deposited over the exposed surfaces by plasma enhanced chemical vapor deposition (PECVD) at a temperature in the range of 300° to 800° C. Thereafter, the structure is subjected to an anisotropic etch, such as a reactive ion etch, that is highly selective of silicon nitride with respect to silicon dioxide. The anisotropic etch forms nitride spacers 134 and 136 adjacent to sidewalls oxides 130 and 132, respectively. Thus, sidewall oxide 130 is sandwiched between sidewall 114 and nitride spacer 134, and sidewall oxide 132 is sandwiched between sidewall 116 and nitride spacer 136. Nitride spacers 134 and 136 each extend 1200 angstroms across substrate 102. Moreover, sidewall oxide 130 and nitride spacer 134 collectively form a source-side spacer, and sidewall oxide 132 and nitride spacer 136 collectively form a drain-side spacer.

Figure 1G:
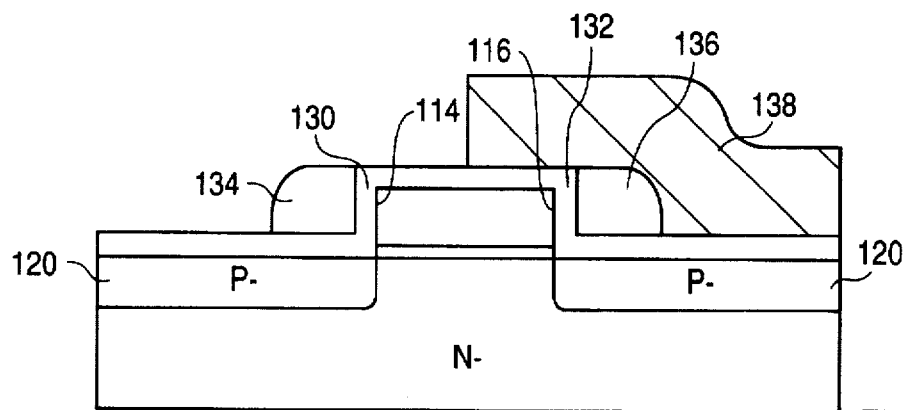

In FIG. 1G, photoresist 138 is deposited as a continuous layer over substrate 102 and selectively irradiated using the photolithographic system and a second reticle to obtain a second image pattern, and the irradiated portions are removed to provide an opening in photoresist 138. The opening is above lightly doped source region 120, nitride spacer 134, sidewall oxide 130 and a first portion of polysilicon gate 112 adjacent to sidewall 114, whereas photoresist 138 covers lightly doped drain region 122, nitride spacer 136, sidewall oxide 132 and a second portion of polysilicon gate 112 adjacent to second sidewall 116.

Figure 1H:
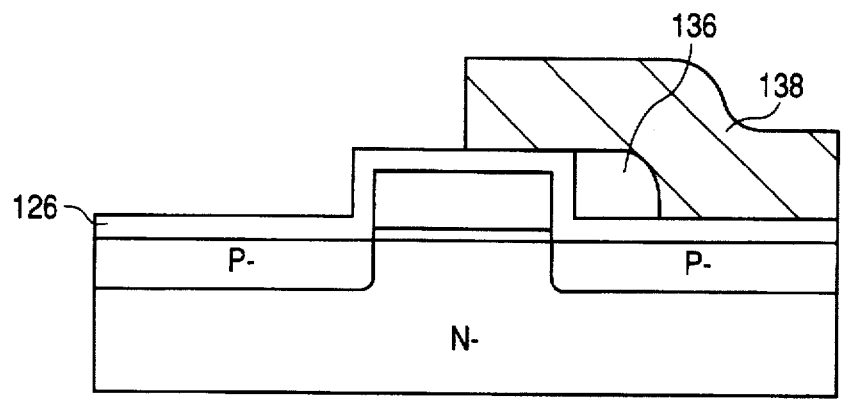

In FIG. 1H, nitride spacer 134 is removed by applying a dry etch that is highly selective of silicon nitride with respect to silicon dioxide. Accordingly, oxide layer 126 outside photoresist 138 is substantially unaffected by the etch. Photoresist 138 provides an etch mask for nitride spacer 136, and the combination of oxide layer 126 and photoresist 138 provide an etch mask for polysilicon gate 112 and substrate 102.

Figure 1I:
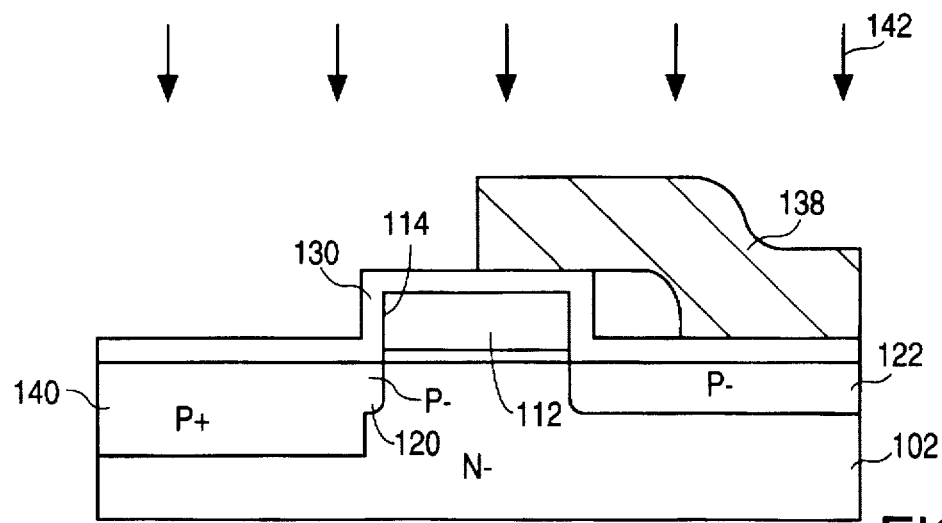

In FIG. 1I, substantially all of lightly doped source region 120 is converted into heavily doped source region 140 by subjecting the structure to ion implantation of boron difluoride, indicated by arrows 142, at a dose of $4.5 \times 10^{15}$ atoms/$cm^2$ and an energy in the range of 10 to 80 kiloelectron-volts. Photoresist 138, the first portion of polysilicon gate 112 (outside photoresist 138) and sidewall oxide 130 provide an implant mask for the underlying portion of substrate 102. As a result, heavily doped source region 140 is substantially aligned with sidewall oxide 130 on the side opposite sidewall 114, and lightly doped drain region 122 is essentially unaffected. Heavily doped source region 140 is doped P+ with a boron concentration in the range of about $1 \times 10^{19}$ to $1 \times 10^{20}$ atoms/$cm^3$. Preferably, the dopant concentration of heavily doped source region 140 is at least 10 times that of lightly doped drain region 122. Finally, as is seen, a very small portion of lightly doped source region 120 remains beneath sidewall oxide 130.

Figure 1J:
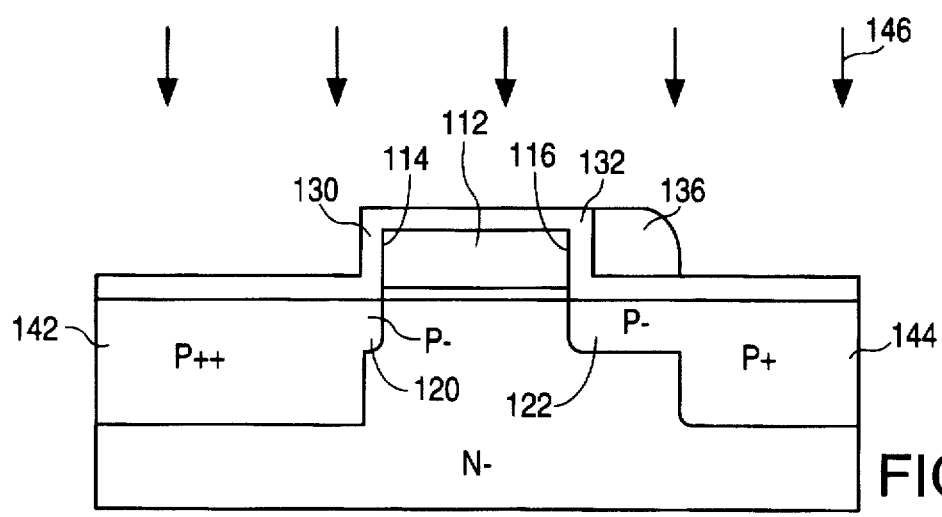

In FIG. 1J, photoresist 138 is stripped, heavily doped source region 140 is converted into ultra-heavily doped source region 142, and a portion of lightly doped drain region 122 outside sidewall oxide 132 and nitride spacer 136 is converted into heavily doped drain region 144 by subjecting the structure to ion implantation of boron difluoride, indicated by arrows 146, at a dose in the range of $2 \times 10^{15}$ to $3 \times 10^{15}$ atoms/$cm^2$ and an energy in the range of 20 to 80 kiloelectron-volts. Polysilicon gate 112, sidewall oxides 130 and 132, and nitride spacer 136 provide an implant mask for the underlying portion of substrate 102. As a result, ultra-heavily doped source region 142 is substantially aligned with sidewall oxide 130 on the side opposite sidewall 114, and heavily doped drain region 144 is substantially aligned with nitride spacer 136 on the side opposite sidewall oxide 132. Furthermore, the portion of lightly doped source region 120 beneath sidewall oxide 130 and the portion of lightly doped drain region 122 beneath sidewall oxide 132 and nitride spacer 136 are essentially unaffected. Ultra-heavily doped source region 142 is doped P++ with a boron concentration in the range of about $1.5 \times 10^{19}$ to $1 \times 10^{21}$ atoms/$cm^3$, and heavily doped drain region 144 is doped P+ with a boron concentration in the range of about $1 \times 10^{19}$ to $1 \times 10^{20}$ atoms/$cm^3$. Preferably, the dopant concentration of ultra-heavily doped source region 142 is at least 1.5 times that of heavily doped drain region 144.

Figure 1K:
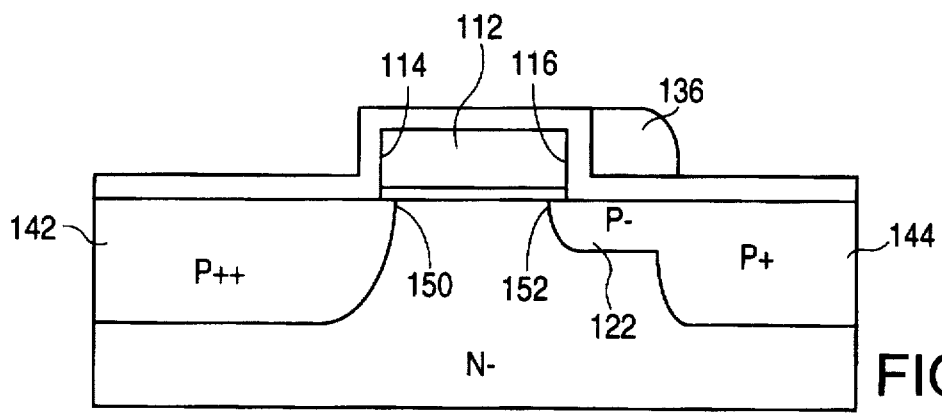

In FIG. 1K, a rapid thermal anneal on the order of 900° to 1050° C. for 10 to 30 seconds is applied to remove crystalline damage and to drive-in and activate the implanted dopants. The boron rapidly diffuses both vertically and laterally during the anneal. As a result, ultra-heavily doped source region 142 diffuses into and essentially eliminates lightly doped source region 120 to form a source, and lightly doped drain region 122 and heavily doped drain region 144 merge to form a drain for a PMOS device controlled by polysilicon gate 112. Ultra-heavily doped source region 142 and lightly doped drain region 122 extend slightly beneath sidewalls 114 and 116, respectively, and heavily doped drain region 144 extends slightly beneath nitride spacer 136. As is seen, heavily doped source region 142 provides a first channel junction 150 that is substantially aligned with sidewall 114, and lightly doped drain region 122 provides a second channel junction 152 that is substantially aligned with sidewall 116. In addition, heavily doped drain region 144 is spaced from channel junction 152.

Further processing steps in the fabrication of IGFETs typically include forming salicide contacts on the gate, source and drain, forming a thick oxide layer over the active region, forming contact windows in the oxide layer to expose the salicide contacts, forming interconnect metallization in the contact windows, and forming a passivation layer over the interconnect metallization. In addition, earlier or subsequent high-temperature process steps can be used to supplement or replace the desired anneal, activation, and drive-in functions. These further processing steps are conventional and need not be repeated herein. Likewise the principal processing steps disclosed herein may be combined with other steps apparent to those skilled in the art.

The present invention includes numerous variations to the embodiment described above. For instance, the gate insulator can remain outside the gate during the ion implantations. The masking layer that defines the gate can remain in place when the lightly doped source and drain regions are implanted. The source may include a very small lightly doped source region adjacent to the first channel junction as long as the lightly doped source region, if any, is far smaller than the lightly doped drain region. Alternatively, the sidewall insulators can be formed before the first ion implantation such that the entire lightly doped source region is converted into the heavily doped source region. The nitride spacers can be replaced by other materials, such as polysilicon, that are selectively removable with respect to the sidewall oxides. The source-side and drain-side spacers may include several layers of sequentially grown or deposited materials, of which only one layer need be subjected to the anisotropic etch. If desired, the source-side and drain-side spacers may consist of oxide spacers. The gate can be various conductors, and the gate insulator can be various dielectrics. Suitable P-type dopants include boron, boron species (such as boron difluoride) and combinations thereof.

Alternatively, if an N-channel device is desired, suitable N-type dopants include arsenic, phosphorus and combinations thereof.

Further details regarding asymmetrical IGFETs are disclosed in U.S. application Ser. No. 08/711,383, now U.S. Pat. No. 5,648,286, filed concurrently herewith, entitled "Method of Making Asymmetrical Transistor With Lightly Doped Drain Region, Heavily Doped Source and Drain Regions, and Ultra-Heavily Doped Source Region" by Gardner et al.; U.S. application Ser. No. 08/711,381, now U.S. Pat. No. 5,677,224, filed concurrently herewith, entitled "Method of Making Asymmetrical N-Channel and P-Channel Devices" by Kadosh et al.; and U.S. application Ser. No. 08/711,957, pending, filed concurrently herewith, entitled "Asymmetrical N-Channel and Symmetrical P-Channel Devices" by Gardner et al.; the disclosures of which are incorporated herein by reference.

The invention is particularly well-suited for fabricating N-channel MOSFETs, P-channel MOSFETs, and other types of IGFETs, particularly for high-performance microprocessors where high circuit density is essential. Although only a single device has been shown for purposes of illustration, it is understood that in actual practice, many devices are fabricated on a single semiconductor wafer as widely practiced in the art. Accordingly, the invention is well-suited for use in integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making an asymmetrical IGFET, comprising the steps of:

providing a semiconductor substrate;

forming a gate with first and second opposing sidewalls over the substrate;

applying a first ion implantation to implant lightly doped source and drain regions into the substrate;

applying a second ion implantation to convert substantially all of the lightly doped source region into a heavily doped source region without doping the lightly doped drain region;

forming a drain-side spacer adjacent to the second sidewall;

applying a third ion implantation to convert substantially all of the heavily doped source region into an ultra-heavily doped source region and to convert a portion of the lightly doped drain region outside the drain-side spacer into a heavily doped drain region without doping a portion of the lightly doped drain region beneath the drain-side spacer; and forming a source and a drain, wherein the source includes the ultra-heavily doped source region, and the drain includes the lightly doped and heavily doped drain regions.

2. The method of claim 1, wherein the source consists of the ultra-heavily doped source region, and the drain consists of the lightly doped and heavily doped drain regions.

3. The method of claim 2, wherein the ultra-heavily doped source region and the lightly doped and heavily doped drain regions extend to a top surface of the substrate.

4. The method of claim 1, wherein a dopant concentration of the heavily doped drain region is at least 10 times that of the lightly doped drain region, and a dopant concentration of the ultra-heavily doped source region is at least 1.5 times that of the heavily doped drain region.

5. The method of claim 4, wherein the dopant concentration of the lightly doped drain region is in the range of about $1 \times 10^{17}$ to $5 \times 10^{18}$ atoms/cm$^3$, the dopant concentration of the heavily doped drain region is in the range of about $1 \times 10^{19}$ to $1 \times 10^{20}$ atoms/cm$^3$, and the dopant concentration of the ultra-heavily doped source region is in the range of about $1.5 \times 10^{19}$ to $1 \times 10^{21}$ atoms/cm$^3$.

6. The method of claim 1, including applying the first ion implantation using the gate as an implant mask.

7. The method of claim 1, including, in sequence:

forming an insulating layer over the substrate, wherein the insulating layer includes first and second sidewall insulators adjacent to the first and second sidewalls, respectively;

forming first and second spacers adjacent to the first and second sidewall insulators, respectively, wherein the drain-side spacer includes the second spacer and the second sidewall insulator;

forming a masking layer over the substrate, wherein the masking layer includes an opening above the lightly doped source region and the source-side spacer and a first portion of the gate, and the masking layer covers the lightly doped drain region and the drain-side spacer and a second portion of the gate;

removing the first spacer;

applying the second ion implantation using the masking layer and the first portion of the gate and the first sidewall insulator as an implant mask;

stripping the masking layer; and applying the third ion implantation using the gate and the second sidewall insulator and the second spacer as an implant mask.

8. The method of claim 7, wherein the masking layer is photoresist.

9. A method of making an asymmetrical IGFET, comprising the steps of:

providing a semiconductor substrate;

forming a gate insulator on the substrate;

forming a gate with first and second opposing sidewalls on the gate insulator;

applying a first ion implantation to implant lightly doped source and drain regions into the substrate and substantially aligned with the first and second sidewalls, respectively;

forming an insulating layer over the substrate, wherein the insulating layer includes first and second sidewall insulators adjacent to the first and second sidewalls, respectively;

forming first and second spacers adjacent to the first and second sidewall insulators, respectively;

forming a masking layer over the substrate, wherein the masking layer includes an opening above the lightly doped source region and the first spacer and the first sidewall insulator and a first portion of the gate, and the masking layer covers the lightly doped drain region and the second spacer and the second sidewall insulator and a second portion of the gate;

removing the first spacer without removing the second spacer;

applying a second ion implantation through the opening to convert substantially all of the lightly doped source region into a heavily doped source region without doping the lightly doped drain region, wherein a dopant concentration of the heavily doped source region exceeds that of the lightly doped drain region;

stripping the masking layer;

applying a third ion implantation to convert substantially all of the heavily doped source region into an ultra-heavily doped source region and to convert a portion of the lightly doped drain region outside the second spacer into a heavily doped drain region without doping a portion of the lightly doped drain region beneath the second spacer, wherein a dopant concentration of the ultra-heavily doped source region exceeds that of the heavily doped drain region, and a dopant concentration of the heavily doped drain region exceeds that of the lightly doped drain region; and forming a source and a drain, wherein the source includes the ultra-heavily doped source region, and the drain includes the lightly doped and heavily doped drain regions.

10. The method of claim 9, including:

applying the first ion implantation using the gate as an implant mask;

applying the second ion implantation using the masking layer and the first portion of the gate and the first sidewall insulator as an implant mask; and applying the third ion implantation using the gate and the second sidewall insulator and the second spacer as an implant mask.

11. The method of claim 9, wherein the dopant concentration of the lightly doped drain region is in the range of about $1 \times 10^{17}$ to $5 \times 10^{18}$ atoms/cm$^3$, the dopant concentration of the heavily doped drain region is in the range of about $1 \times 10^{19}$ to $1 \times 10^{20}$ atoms/cm$^3$, and the dopant concentration of the ultra-heavily doped source region is in the range of about $1.5 \times 10^{19}$ to $1 \times 10^{21}$ atoms/cm$^3$.

12. The method of claim 9, wherein the gate is polysilicon, the gate insulator is silicon dioxide and the insulating layer is silicon dioxide.

13. The method of claim 9, wherein the masking layer is photoresist.

14. The method of claim 9, wherein forming the spacers includes depositing a blanket layer of silicon nitride on the insulating layer, and then applying a reactive ion etch.

15. The method of claim 9, wherein the ultra-heavily doped source region provides a first channel junction substantially aligned with the first sidewall, and the lightly doped drain region provides a second channel junction substantially aligned with the second sidewall.

16. The method of claim 9, wherein the substrate is P-type, the ion implantations implant an N-type dopant, and the IGFET is an N-channel device.

17. The method of claim 9, wherein the substrate is N-type, the ion implantations implant a P-type dopant, and the IGFET is a P-channel device.

18. A method of making an asymmetrical IGFET, comprising the following steps in the sequence set forth:

providing a semiconductor substrate of first conductivity type;

forming a gate oxide on the substrate;

forming a polysilicon gate with first and second opposing sidewalls on the gate oxide;

applying a first ion implantation using the polysilicon gate as an implant mask to implant lightly doped source and drain regions of second conductivity type into the substrate and substantially aligned with the first and second sidewalls, respectively;

forming an oxide layer over the substrate, wherein the oxide layer includes a first and second sidewall oxides adjacent to the first and second sidewalls, respectively;

depositing a blanket layer of spacer material on the oxide layer and then applying an anisotropic etch to form first and second spacers adjacent to the first and second sidewall oxides, respectively;

forming a photoresist layer over the substrate, wherein the photoresist layer includes an opening above the lightly doped source region and the first spacer and the first sidewall oxide and a first portion of the polysilicon gate adjacent to the first sidewall, and the photoresist layer covers the lightly doped drain region and the second spacer and the second sidewall oxide and a second portion of the polysilicon gate adjacent to the second sidewall;

removing the first spacer;

applying a second ion implantation using the photoresist layer and the first sidewall oxide and the first portion of the polysilicon gate as an implant mask to convert substantially all of the lightly doped source region into a heavily doped source region of second conductivity type without doping the lightly doped drain region;

stripping the photoresist layer; and applying a third ion implantation using the polysilicon gate and the second sidewall oxide and the second spacer as an implant mask to convert the heavily doped source region into an ultra-heavily doped source region of second conductivity type and to convert a portion of the lightly doped drain region outside the second sidewall oxide and the second spacer into a heavily doped drain region of second conductivity type without doping a portion of the lightly doped drain region beneath the second sidewall oxide and the second spacer;

wherein a source includes the ultra-heavily doped source region, a drain includes the lightly doped and heavily doped drain regions, the source provides a first channel junction, the lightly doped drain region provides a second channel junction, and the heavily doped drain region is spaced from the second channel junction.

* * * * *

UNITED STATES PATENT AND TRADEMARK OFFICE
CERTIFICATE OF CORRECTION

PATENT NO.    : 5,759,897
DATED         : June 2, 1998
INVENTOR(S)   : Kadosh Daniel; Gardner Mark I.; Dawson Robert Page 1 of 1

It is certified that error appears in the above-identified patent and that said Letters Patent is hereby corrected as shown below:

Column 1,
Lines 18 and 19, delete "the channel and"; and

Column 7,
Line 26, after the word "in" and before the word "integrated" insert the word -- an --.

Signed and Sealed this

Eighteenth Day of December, 2001

Attest:

JAMES E. ROGAN
Attesting Officer    Director of the United States Patent and Trademark Office